(12) United States Patent
Ma et al.

(10) Patent No.: US 6,342,323 B1
(45) Date of Patent: Jan. 29, 2002

(54) ALIGNMENT METHODOLOGY FOR LITHOGRAPHY

(75) Inventors: William Hsioh-Lien Ma, Fishkill, NY (US); David Vaclay Horak, Essex Junction, VT (US); Toshiharu Furukawa, Essex Junction, VT (US); Steven J. Holmes, Milton, VT (US); Mark Charles Hakey, Milton, VT (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/523,796

(22) Filed: Mar. 13, 2000

(51) Int. Cl.⁷ .................................................. G03F 9/00
(52) U.S. Cl. ........................................ 430/22; 356/399
(58) Field of Search ............................. 430/22; 356/399

(56) References Cited

U.S. PATENT DOCUMENTS

| 5,731,113 A | 3/1998 | Ueno | 430/22 |
| 5,879,843 A | 3/1999 | Ueno | 430/22 |
| 5,989,761 A * | 11/1999 | Kawakubo et al. | 430/22 |
| 6,042,975 A * | 3/2000 | Burm et al. | 430/22 |
| 6,127,075 A * | 10/2000 | Hsa | 430/22 |
| 6,128,070 A * | 10/2000 | Peng | 430/22 |

* cited by examiner

*Primary Examiner*—Christopher G. Young
(74) *Attorney, Agent, or Firm*—Scully, Scott, Murphy & Presser; William D. Sabo

(57) ABSTRACT

An improved alignment methodology for lithography. In the method, a third level is aligned to two previous levels, where the alignment mark location for the third level is calculated based upon the two previous levels in both the x- and y-directions. A preferred embodiment of the invention relates to a lithography alignment method for aligning a third level of a semiconductor device relative to first and second previous levels of the device. The method comprises the steps of forming first and second patterns at the first and second levels respectively, and determining offsets of the first and second patterns in two orthoginal directions. An optimum location for a third pattern in the third level is then determined based on an average of the offsets of the first and second patterns.

20 Claims, 6 Drawing Sheets

Alignment Mark on mask A

Alignment Mark on mask B

Level 3 Mark: on wafer with levels 1 & 2 exposed

**Alignment Mark on wafer:
Mask A on top of Mask B**

Level 4 Mark: on Mask C

An Improved Alignment Methodology for Lithography

Figure 7

An Improved Alignment Methodology for Lithography

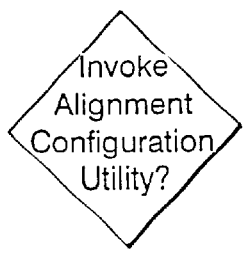

Alignment Configuration Utility
 -drop down window for manual selection
 -select/input multiple weighting
  factors in both X and y directions
 -select algorithm for weighting factor
  to determine overlay offset in both
  X and Y direction with respect to
  a reference point or to a alignment mark Alignment Utility
 -active the predetermined algorithm

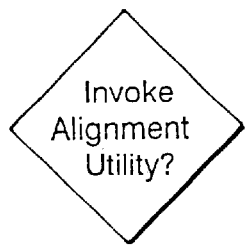

An example:
 -scan marks Ax & Ay (on level 1)
  and register locations
 -scan marks Bx & By (on level2)
  and register locations
 -use algorithm provide in the
  Configuration Utility and calculate
  Overly offset
 -Step & repeat with the desirable
  offset and expose Examples of algorithm
Averaging
1. X offset: $(X1 + X2 + X3 + ..)/N$; Y offset: $(Y1 + Y2 + Y3 + ..)/N$ 2. X offset: $(\sigma X1 + \beta X2 + \xi X3 + ...)/N$, Y offset: $(\varphi Y1 + \upsilon Y2 + \eta Y3 + ...)/N$ Where Xi and Yi = position, skew, rotation, magnification, etc.
   N = # of variables $\upsilon, \beta, \xi, \sigma ...$ = Weighting factors Conventional Alignment
(1st order: RX->PC.MC->PC=0.1u, 2nd order MC->RX=0.14u)

Proposed alignment method: MC->RX=0.12u and MC->PC=0.12u

Area Gain = (0.1677 - 0.1521)/0.1677=9.3%

ALIGNMENT METHODOLOGY FOR LITHOGRAPHY

BACKGROUND OF THE INVENTION

This invention generally relates to lithography procedures for making semi-conductor devices; and more specifically, to aligning the layers of multiple layer semi-conductor devices.

Semiconductor devices are typically constructed with many layers of mask levels. Each of these mask level is typically aligned to the immediately previous level or to one of the previous levels. The relative position of these levels and the ability to control the levels determine how a particular level is designed and processed. The present state-of-the-art alignment methodology allows a current mask level to be aligned to only one of the previous levels. As devices become smaller, the ability to align several mask levels becomes important, and this present state-of-the-art one level-to-one level alignment methodology is not sufficient.

Alignment methodology is important, for example, in the case of contacts and MC, where one may wish to align to diffusions and to the gate at the same time. As a second example, alignment is important in situations, such as in the case of fabrication of a MINT DRAM cell, where one would need to align buried strip and Deep Trench and Isolation Trench. In another DRAM example, one may, wish to align Gate shallow trench and deep trench.

SUMMARY OF THE INVENTION

An object of this invention is to improve alignment methodologies for lithography.

Another object of the present invention is to provide an improved alignment methodology for lithography that allows one to optimize the alignment for the current level to two previous levels.

These and other objectives are attained, in a lithography procedure, with a method of aligning a third level to two previous levels, where the alignment mark location for the third level is calculated based upon the two previous levels in both the x- and y-directions.

A preferred embodiment of the invention relates to a lithography alignment method for aligning a third level of a semiconductor device relative to first and second previous levels of the device. The method comprises the steps of forming first and second patterns at the first and second levels respectively, and determining offsets of the first and second patterns in two orthoginal directions. An optimum location for a third pattern in the third level is then determined based on an average of the offsets of the first and second patterns.

This invention may use either an averaged position method for each level/chip or a weighted average position method, depending on the relative tolerances of each level/chip to improve significantly the alignment of the current level to previous levels. The present invention utilizes the principal that, if one knows the position of alignment marks for level A and for level B, one can then calculate the relative positions between levels A and B. Based upon this knowledge, one can then align the current level to a new alignment mark whose position/location is based on the relative positions of levels A and B. Thus, the third level is now aligned and placed at the optimum position. This methodology can be implement via software or a combination of software and a new set of alignment marks.

With the conventional prior art, one would optimize the alignment via an alignment tree and by choosing one level to align to. It has also been proposed previously that one aligns X-direction to one level and Y-direction to another level. This is an improvement over the conventional alignment methodology but it improves only one direction per level. The present invention allows one to optimize the alignment to two previous levels.

Further benefits and advantages of the invention will become apparent from a consideration of the following detailed description, given with reference to the accompanying drawings, which specify and show preferred embodiments of the invention.

BRIEF DESCRIPTION OF THE DRAWINGS

FIG. 7 indicates steps of the alignment configuration utility and of the alignment utility shown in FIG. 6.

DETAILED DESCRIPTION OF THE PREFERRED EMBODIMENTS

Figure 1:
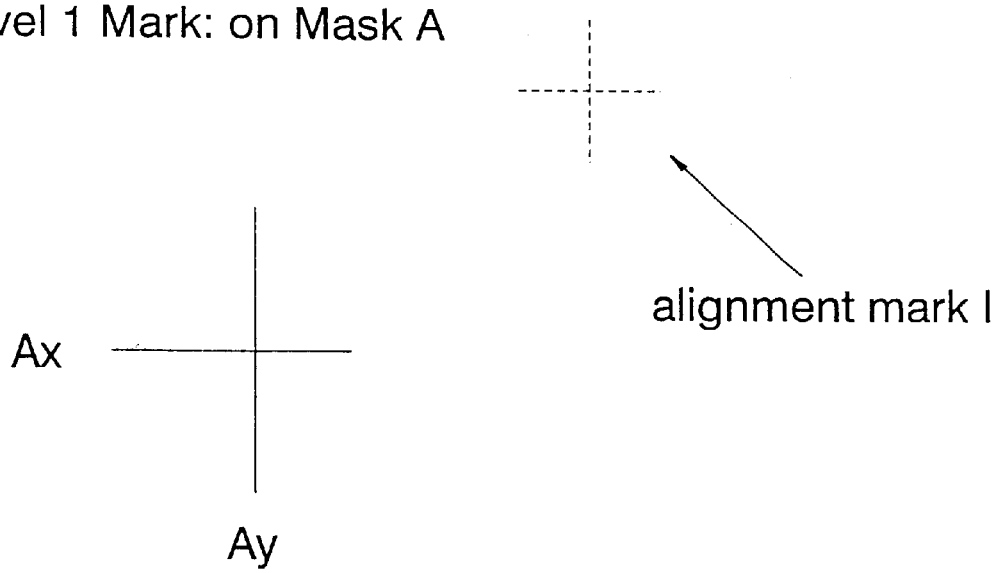
FIG. 1 illustrates an alignment mark on a first layer.
Figure 2:
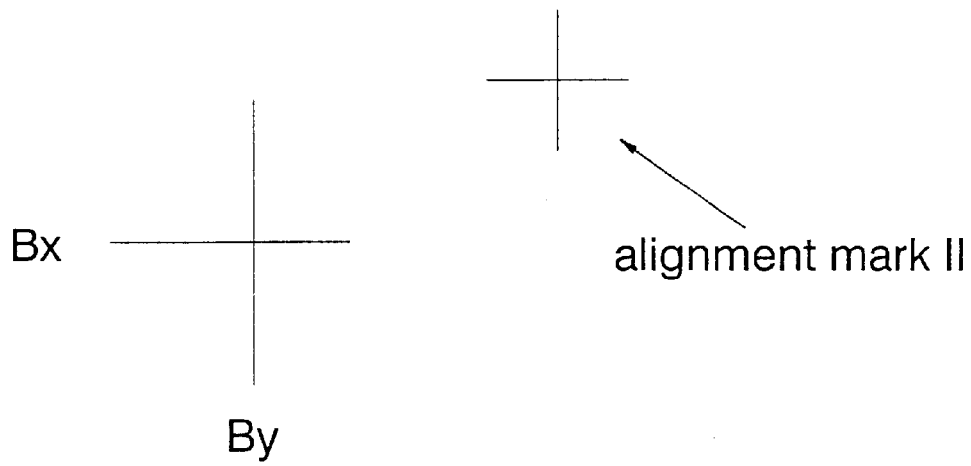
FIG. 2 shows an alignment mark on a second layer.
Figure 3:
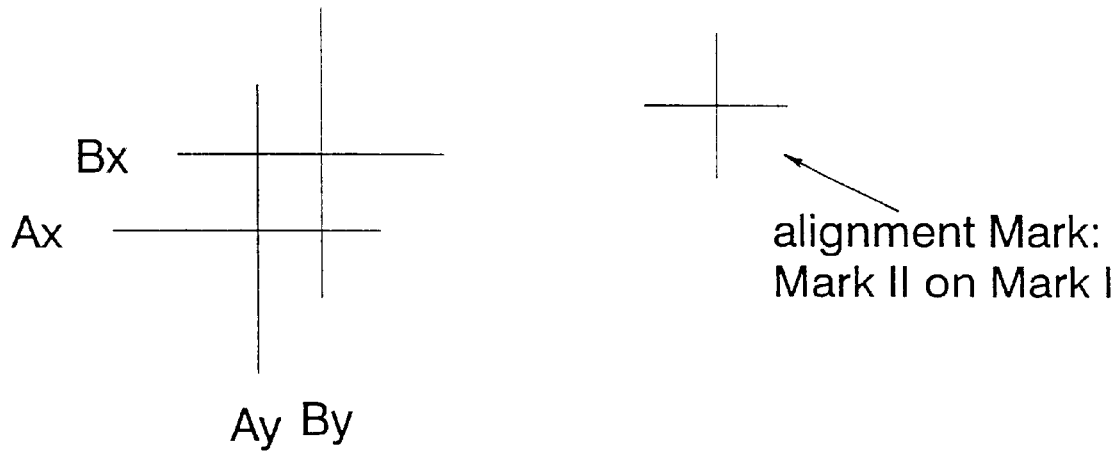
FIG. 3 shows the alignment marks of FIGS. 1 and 2 when the first layer is on top of the second layer.
Figure 4:
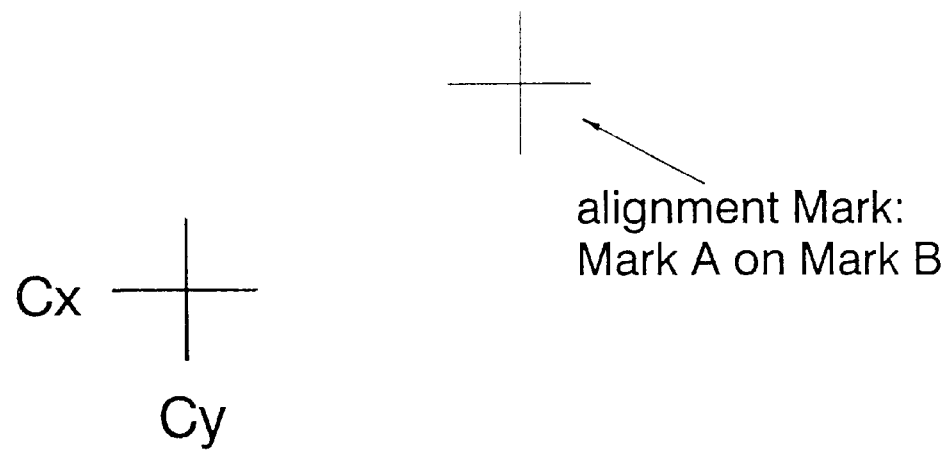
FIG. 4 illustrates an alignment mark on a third layer.
Figure 5:
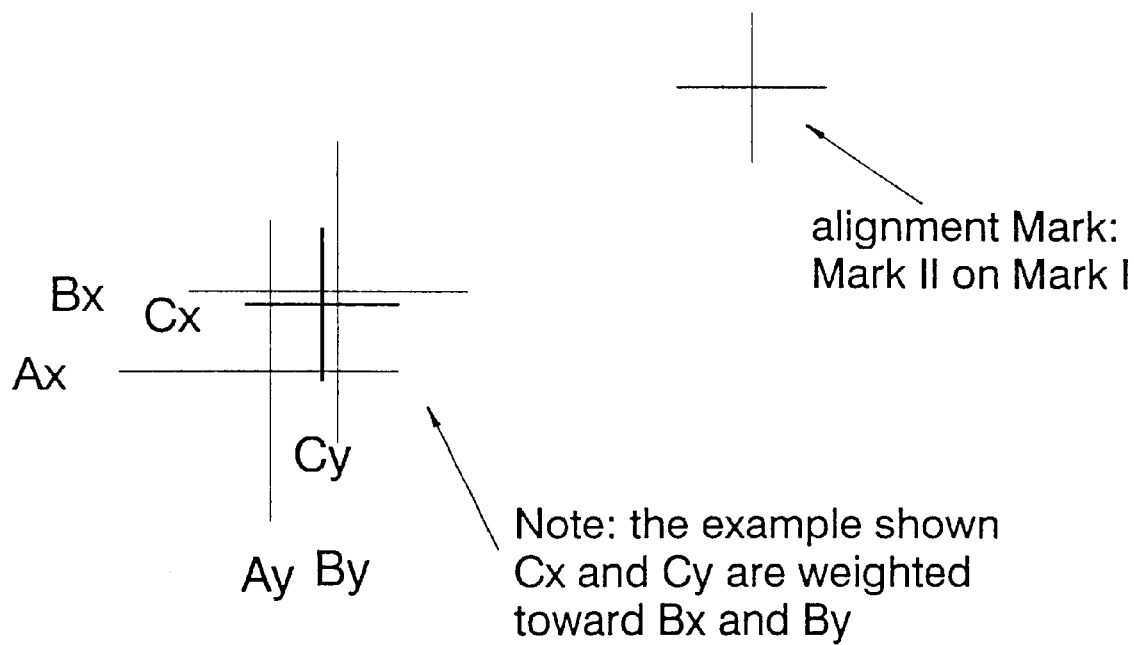
FIG. 5 shows the alignment marks of FIGS. 1, 2 and 4 when the third layer is on top of the first and second layers.

A method embodying the invention (via software modification and an example of alignment mark design) is shown in FIGS. 1–5. Generally, this method includes the steps of exposing and developing Mask A onto a wafer (FIG. 1); exposing and developing Mask B onto the wafer, using alignment mark II aligned to mark I (FIGS. 2 and 3); and aligning Mask C (FIG. 4) onto the wafer (FIG. 5). This alignment is done by (1) scanning and determining mark locations for Ax, Ay, Bx and By, (2) calculating 30 optimum location for Mask C using pre-determined weighting factors and weighted average formula, and (3) calculating overlay of set for Mask C alignment marks with respect to level "1" marks or level "2" marks based upon the optimum location calculation from step (2). That is, the alignment marks Cx and Cy are offset with respect to either Ax and Ay or Bx and By prior to exposure.

Instead of the typical alignment that align the latest mask to an earlier one, this invention allows one to optimize alignment to two previous levels in both X and Y directions. The alignment mark Cx and Cy on Mask C is positioned with an optimum offset with respect to marks Ax and Ay or Bx and By. This offset is determined via scanning and by recording the previous marks, and is calculated via a pre-determined algorithm using weighting factors.

As an alternate embodiment, modification to existing software allows one to record the average/weighted average of the position of each level with respect to the reference marks on the reticle. One can use a photo-tool to scan each mark and to locate and to record the position of the two levels. With the mark location known, software is used to determine the optimum offset of the alignment mark for the next reticle. For example, the Nikon mark consists of three horizontal (or vertical) lines. The tool could scan across all the lines to collect all the data at once. The software then recognizes these marks and optimize a new location for the new level.

Figure 6:
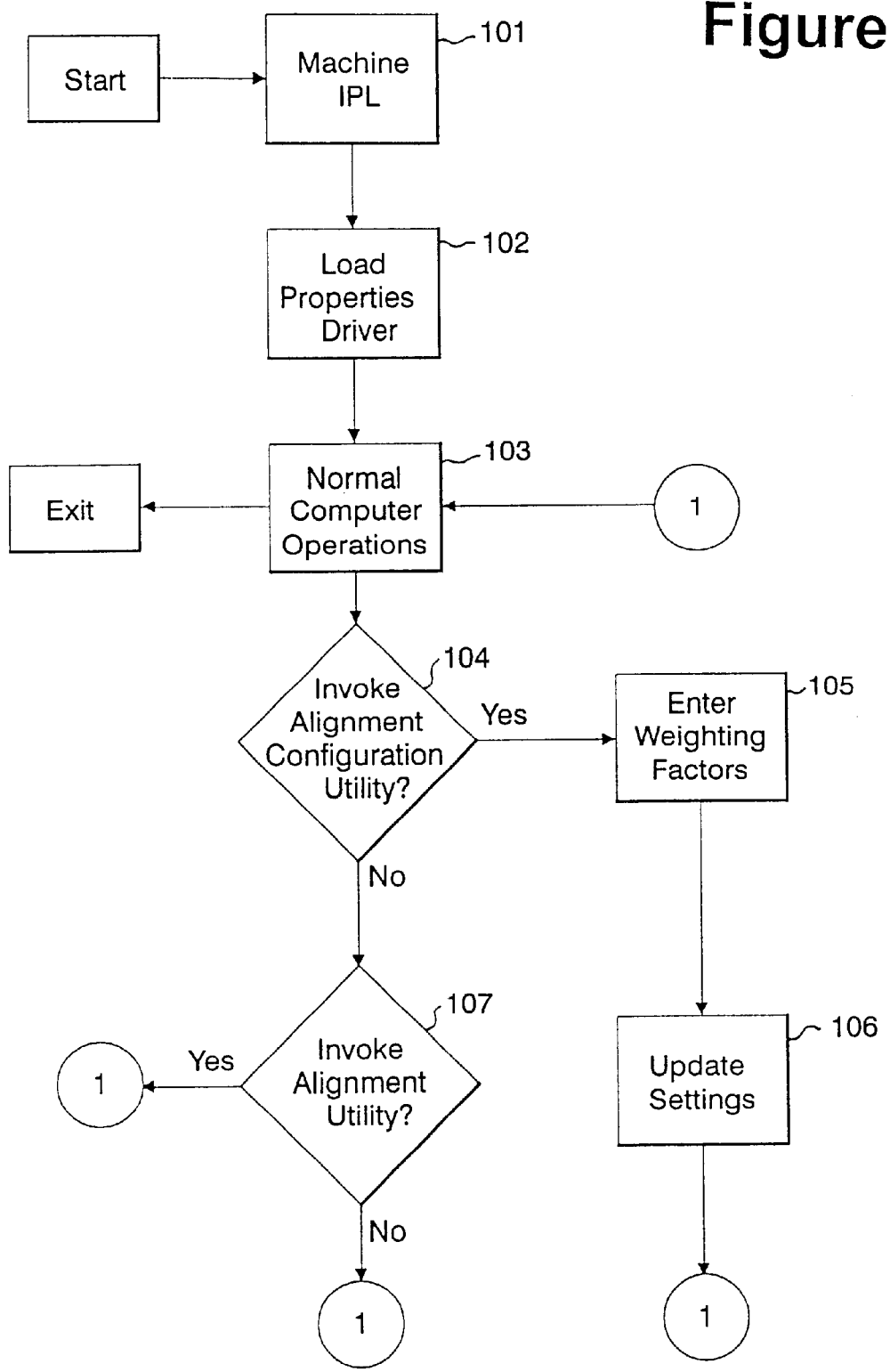
FIG. 6 is a flow chart outlining the alignment methodology of this invention.

FIG. 6 is a flow chart illustrating a lithography procedure embodying the present invention. More specifically, this flow chart outlines the operation of a computer that controls the lithography procedure. At step 101, the computer is started, and at step 102, the computer is provided with properties or values needed for the lithography procedure and computer operation. Step 103 represents normal operation of the computer.

Step 104 represents the option of invoking an alignment configuration utility. With reference to FIGS. 6 and 7, if this utility is invoked, an operator may input the desired weighting factors, as specifically represented by step 105 in FIG. 6, and the operator may also input the desired algorithm for determining the offset. Preferably, the offset is determined in both x and y directions with respect to a reference point or to an alignment mark. Step 106 of FIG. 6 represents the computer settings being updated to reflect the input information. This configuration information is then stored in the computer memory, until further update.

After the computer settings are updated, the routine returns to step 103, and from there proceeds to step 104 and then to step 107. Step 107 represents the option of invoking the alignment utility to determine the desired or optimum location for a layer of the semi-conductor device. With reference to FIGS. 6 and 7, if this utility is invoked, offset measurements in both the x and y directions are taken for levels one and two. Then, using the provided algorithm, an overlay offset value is calculated for the third level. The sub-steps listed in FIG. 7 may be repeated a number of times. Once the offset has been calculated, the routine returns to step 103 and the computer, using this computed offset but otherwise functioning in a normal mode, operates the lithography procedure to form the third level in the semiconductor device.

Any suitable algorithm may be used to calculate the x and y offsets. Examples of suitable algorithms are set forth below.

Averaging
1. X offset:$(X1+X2+X3+...)/N$; Y offset: $(Y1+Y2+Y3+...)/N$

Weighted averaging
2. X offset: $(\sigma X1+\beta X2+\xi X3+...)/N$,
   Y offset: $(\phi Y1+\nu Y2+\eta Y3+...)/N$
where Xi and Yi=position, skew, rotation, magnification, etc.
N=π of variables
$\nu\beta\xi\sigma...$ =Weighting factors An example of density improvement due to the alignment methodology of this invention is illustrated in FIGS. 8 and 9 and discussed below using PC, RX and MC.

Figure 8:
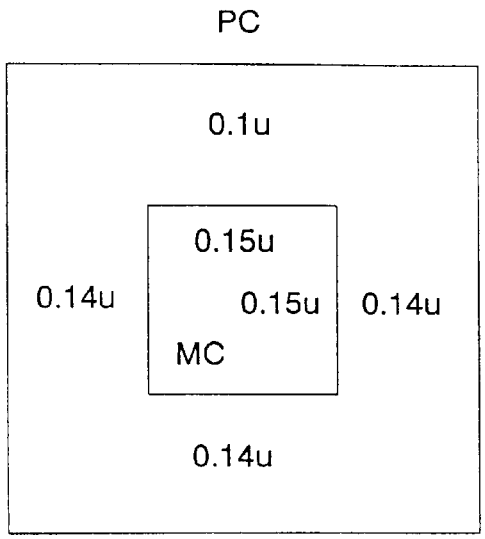
FIGS. 8 and 9 illustrate the density improvement due to the alignment methodology of this invention.
Figure 9:
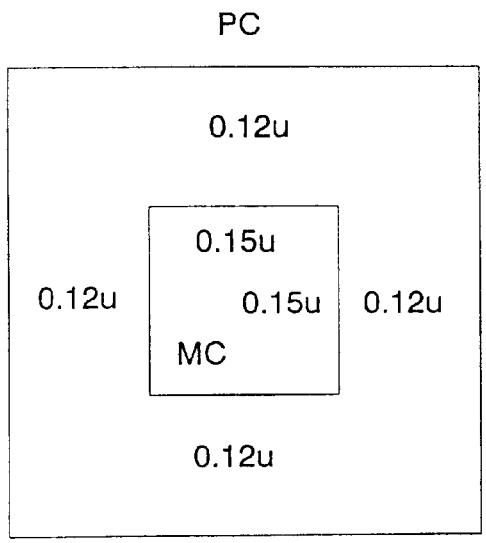

With reference to FIG. 8, with conventional alignment methodology: Assuming tolerance A, for MC to PC, is equal to 0.1 u and B, RX to PC, is also equal to 0.1 u, then the second order alignment tolerance C, of MC to RX, would be equal to 0.14 u. Assume MC area=1.5×1.5 u. Minimum RX Area=$(0.1+0.15+0.14)\times(0.14+0.15+0.14)=0.1677$ um$^2$ With reference to FIG. 9, with the alignment methodology of this invention: Assuming a 50%–50% weighting factor for the alignment method, aligning MC to RX and PC, then the alignment tolerance is expected to be less than 0.14 u but larger than 0.1 u. If it is assumed that the alignment tolerance is 0.12 u, the above calculation can be re-done as follows.

Minimum RX Area=$(0.12+0.15+0.12)\times(0.12+0.15+0.12)=0.1521$ um$^2$

The area gained using the present invention is determined as:

Area Gain=$(0.1677-0.1521)/0.1677=9.3\%$

With the present invention, given three levels, A, B, and C, with an alignment tree in the order of C aligned to B aligned to A, represented as: C→B→A. The alignment of C to B and the alignment of B to A are first order alignments, and the alignment of C to A is a second order alignment.

The alignment overlay tolerances (OLT) for 1st order alignment are:

$$OLT_{(A,B)}=SQRT(A^2_{o1})=A_{o1} \text{ for B→A, and} \qquad (I)$$

$$OLT_{(B,C)}=SQRT(B^2_{o1})=B_{o1} \text{ for C→B.} \qquad (II)$$

The alignment overlay tolerance for the second order alignment is:

$$OLT_{(A,C)}=SQRT(A^2_{o1}+B^2_{o1}) \text{ for C→A.} \qquad (III)$$

With the alignment methodology of the present invention, the OLT are given by
In the X-direction $$OLT_{(C,A+B)}=SQRT(A^2_{o1}+(B_{o1}(1-X1))^2), \text{ and} \qquad (IV)$$

$$OLT_{(C,A+B)}=SQRT(B^2_{o1}+A_{o1}X1)^2) \qquad (V)$$

In the Y-direction $$OLT_{(C,A+B)}=SQRT(B^2_{o1}+(A_{o1}Y1)^2), \text{ and} \qquad (VI)$$

$$OLT_{(C,A+B)}=SQRT(B^2_{o1}+(A_{o1}Y1)^2). \qquad (VII)$$

Where X1 and Y1=weighting factors in the X-and Y-direction (If C aligns to A, then x1=1,Y1=1; if C aligns to B, then X1=0 and Y1=0)

For example, If in the extreme case that C is aligned to B, then X1=0 and Y1=0, and equations (IV), (V), (VI) and (VII) would then reduce to (II) and (III).

If the weighting factor X1 and Y1=0.5, then the above equations indicate somewhat worse first order alignment tolerance and an improved second order alignment tolerance.

This alignment methodology of the present invention allows one to weigh the criticality of the alignment with respect to two or more previous levels and to assign-multiple weighting factors in both the X and Y directions to provide the most optimum alignment.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of alignment a third level to both of two previous levels, where the alignment mark location for the third level is calculated based upon both of the two previous level in both the x- and y-direction.

2. A lithography alignment method for aligning a third level of a semiconductor device relative to both of first and second previous levels of the semiconductor device, comprising the steps of:

forming a first pattern in the first level;

forming a second pattern in the second level;

determining an offset of the first pattern in two orthogonal directions;

determining an offset of the second pattern in two orthogonal directions; and forming a third pattern in the third level, including the step of determining an optimum location for the third pattern in the third level based on an average of the offsets of the first and second patterns.

3. A method according to claim 2, wherein the step of determining the optimum location for the third pattern includes the step of determining the optimum location for the third pattern in the third level based on a weighted average of the offsets in the first and second patterns.

4. A method according to claim 2, wherein the step of determining the optimum location for the third pattern includes the step of determining the optimum location for the third pattern in the third level based on an averaged position of the offsets of the first and second patterns.

5. A method according to claim 2, further comprising the step of invoking an alignment configuration utility, and using said alignment configuration utility to perform the steps of determining the offset of the first pattern, determining the offset of the second pattern, and determining the optimum location for the third pattern.

6. A method according to claim 5, wherein the step of invoking the alignment configuration includes the steps of:
   selecting weighting factors for both of said directions; and
   selecting an algorithm to determine the offsets of the first and second patterns.

7. A method according to claim 6, wherein the step of selecting an algorithm includes the step of selecting an algorithm to determine the offsets of the first and second patterns with respect to a reference point or to an alignment mark.

8. A method according to claim 2, wherein:
   the second pattern is on top of the first pattern, and the third pattern is on top of the second pattern;
   the step of determining an offset of the first pattern includes the step of determining a mark location for an alignment mark on the first level;
   the step of determining an offset of the second pattern includes the step of determining a mark location for an alignment mark on the second level;
   the step of determining the location for the third level includes the steps of
      i) calculating a location for the third level based on the locations of the alignment marks on both the first and second levels, and
      ii) based on said calculated location, determining an offset for an alignment mark on the third level with respect to the alignment mark on the first or second levels.

9. A lithography alignment system for aligning a third level of a semiconductor device relative to both of first and second previous levels of the semiconductor device, comprising:
   means for forming a first pattern in the first level;
   means for forming a second pattern in the second level;
   means for determining an offset of the first pattern in two orthogonal directions;
   means for determining an offset of the second pattern in two orthogonal directions; and
   means for forming a third pattern in the third level, including the step of determining an optimum location for the third pattern in the third level based on an average of the offsets of the first and second patterns.

10. A system according to claim 9, wherein the means for determining the optimum location for the third pattern includes means for determining the optimum location for the third pattern in the third level based on a weighted average of the offsets in the first and second patterns.

11. A system according to claim 9, wherein the means for determining the optimum location for the third pattern includes means for determining the optimum location for the third pattern in the third level based on an averaged position of the offsets of the first and second patterns.

12. A method according to claim 9, further comprising means for invoking an alignment configuration utility, and using said alignment configuration utility to determine the offset of the first pattern, to determine the offset of the second pattern, and to determine the optimum location for the third pattern.

13. A method according to claim 12, wherein the means for invoking the alignment configuration includes:
   means for selecting weighting factors for both of said directions; and
   means for selecting an algorithm to determine the offsets of the first and second patterns.

14. A method according to claim 13, wherein the means for selecting an algorithm includes means for selecting an algorithm to determine the offsets of the first and second patterns with respect to a reference point or to an alignment mark.

15. A program storage device readable by machine, tangibly embodying a program of instructions executable by the machine to perform method steps for aligning a third level of a semiconductor device relative to both of first and second previous levels of the semiconductor device, said method steps comprising:
   forming a first pattern in the first level;
   forming a second pattern in the second level;
   determining an offset of the first pattern in two orthogonal directions;
   determining an offset of the second pattern in two orthogonal directions; and
   forming a third pattern in the third level, including the step of determining an optimum location for the third pattern in the third level based on an average of the offsets of the first and second patterns.

16. A program storage device according to claim 15, wherein the step of determining the optimum location for the third pattern includes the step of determining the optimum location for the third pattern in the third level based on a weighted average of the offsets in the first and second patterns.

17. A program storage device according to claim 15, wherein the step of determining the optimum location for the third pattern includes the step of determining the optimum location for the third pattern in the third level based on an averaged position of the offsets of the first and second patterns.

18. A program storage device according to claim 15, wherein said method steps further comprise the step of invoking an alignment configuration utility, and using said alignment configuration utility to perform the steps of determining the offset of the first pattern, determining the offset of the second pattern, and determining the optimum location for the third pattern.

19. A program storage device according to claim 18, wherein the step of invoking the alignment configuration includes the steps of:
   selecting weighting factors for both of said directions; and
   selecting an algorithm to determine the offsets of the first and second patterns.

20. A program storage device according to claim 18, wherein the step of selecting an algorithm includes the step of selecting an algorithm to determine the offsets of the first and second patterns with respect to a reference point or to an alignment mark.

* * * * *